US009029234B2

(12) United States Patent
Safran et al.

(10) Patent No.: US 9,029,234 B2
(45) Date of Patent: May 12, 2015

(54) PHYSICAL DESIGN SYMMETRY AND INTEGRATED CIRCUITS ENABLING THREE DIMENTIONAL (3D) YIELD OPTIMIZATION FOR WAFER TO WAFER STACKING

(75) Inventors: John Matthew Safran, Wappingers Falls, NY (US); Daniel Jacob Fainstein, Beacon, NY (US); Gary W. Maier, Poughkeepsie, NY (US); Yunsheng Song, Poughkeepsie, NY (US); Norman Whitelaw Robson, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 13/471,869

(22) Filed: May 15, 2012

(65) Prior Publication Data

US 2013/0307159 A1 Nov. 21, 2013

(51) Int. Cl.
  *H01L 21/76* (2006.01)
  *H01L 21/46* (2006.01)
  *H01L 23/52* (2006.01)
  *H01L 23/48* (2006.01)
  *H01L 27/146* (2006.01)
  *H01L 23/00* (2006.01)

(52) U.S. Cl.
  CPC ...................... *H01L 24/94* (2013.01)

(58) Field of Classification Search
  CPC ...................................... H01L 24/94
  USPC .................. 438/406, 455; 257/777, E27.137, 257/E27.144
  See application file for complete search history.

(56) References Cited

U.S. PATENT DOCUMENTS

| | | | |
|---|---|---|---|
| 5,508,565 A | 4/1996 | Hatakeyama et al. | |
| 5,818,748 A | 10/1998 | Bertin et al. | |
| 6,013,948 A | 1/2000 | Wood et al. | |
| 6,069,025 A | 5/2000 | Kin | |
| 6,730,527 B1 | 5/2004 | Norman | |
| 7,098,541 B2 | 8/2006 | Adelmann | |
| 7,358,616 B2 | 4/2008 | Alam et al. | |
| 7,525,137 B2 | 4/2009 | Walker et al. | |
| 7,768,138 B2 | 8/2010 | Shinagawa | |
| 2006/0256525 A1 | 11/2006 | Shim et al. | |
| 2008/0203581 A1 | 8/2008 | Thomas et al. | |
| 2009/0319968 A1 | 12/2009 | Wang et al. | |
| 2010/0013108 A1 | 1/2010 | Gibson et al. | |
| 2011/0065214 A1* | 3/2011 | Farooq et al. .................. | 438/15 |
| 2011/0080189 A1 | 4/2011 | Gluschenkov et al. | |
| 2011/0109381 A1 | 5/2011 | Foster, Sr. et al. | |
| 2011/0272798 A1 | 11/2011 | Lee et al. | |

FOREIGN PATENT DOCUMENTS

JP 2001157307 9/2001

* cited by examiner

*Primary Examiner* — Luan C Thai
(74) *Attorney, Agent, or Firm* — Joselyn Cockburn (57) ABSTRACT

One of the wafers in a semiconductor wafer to wafer stack can be rotated a predefined number of positions, relative to a previous wafer in the stack, and bonded in the position in which the maximum number of good die are aligned. An adjustment circuit on each die reroutes signals received from a pad that has been relocated due to rotation. A communication channel formed from a pair of pads that are interconnected by a Through Substrate Vias can be placed in each die and can convey selected information from one die to the next. A code representative of the position orientation of each die can be recorded in a Programmable Read Only Memory located on each die, or may be down loaded from a remote source. Any additional wafer may be stacked serially, and each one may be rotated relative to the wafer that precedes it in the stack.

26 Claims, 10 Drawing Sheets

| OFFSET | CODE |
|---|---|
| 0 DEGREES | 0 |
| 180 DEGREES | 1 |

P =4

| OFFSET | CODE |
|---|---|
| 0 DEGREES | 00 |
| 90 DEGREES | 01 |
| 180 DEGREES | 10 |
| 270 DEGREES | 11 |

FIG. 8

MUX S INPUT GENERATION LOGIC TABLE FOR ROTATIONAL POSITIONS (P) = 2

| CURRENT WAFER ORIENTATION TO PREVIOUS WAFER | CURRENT WAFER OFFSET CODE | PREVIOUS WAFER MUX S | CURRENT WAFER MUX S |
|---|---|---|---|
| 0 DEGREES | 0 | 0 | 0 |
| 0 DEGREES | 0 | 1 | 1 |
| 180 DEGREES | 1 | 0 | 1 |
| 180 DEGREES | 1 | 1 | 0 |

FIG. 13 dimensional (3D) yield optimization
PHYSICAL DESIGN SYMMETRY AND INTEGRATED CIRCUITS ENABLING THREE DIMENTIONAL (3D) YIELD OPTIMIZATION FOR WAFER TO WAFER STACKING

CROSS-REFERENCE TO RELATED PATENT APPLICATION

The present application relates to US Published Patent Application, Pub. No US2011/0065214A1 published on Mar. 17, 2011, and assigned to International Business Machines Corporation, assignee of the present application. The published patent application, among other teachings, discloses a process to maximize the alignment of good die by rotating selected wafers in a stack of wafers.

BACKGROUND

The present invention relates to semiconductor technology, and more specifically, to circuits and processes for maximizing 3D yield from a wafer to wafer stack.

One of the primary goals of semiconductor providers is to provide quality semiconductor devices at minimum cost. Semiconductor devices are major components in most, if not all, end user products. Because of this pervasive use, the cost of semiconductor devices directly affects the overall cost of user products. A relatively low cost semiconductor device could reduce the price of end user products; whereas a relatively high cost semiconductor device could increase the price of end user products. As is well known, the low cost providers of quality products are most likely to succeed in the market-place.

As a result of this interrelation between cost of components and the cost of end products, the providers of semiconductor products or components are constantly looking for ways to lower component cost. It has been determined that maximizing the yield of semiconductor products, preferably during design and fabrication, has a direct effect on the cost of the product. As yield increases, the price of the semiconductor product decreases and vice versa. Wafer stacking is one of the solutions in 3D integration technology that has the potential to lower cost, lower power, and improve performance. However, it is necessary to observe certain rules during the stacking, bonding, and dicing of the wafers as the rules could have a large impact on yield and cost, thereby decreasing the value of 3D stacking. One of the important rules of stacking is that the resulting stack must include only functional or good die. If a non functional or bad die is included in the stack, the entire stack could be non functional and may have to be electronically repaired, reworked or, in the worst case, discarded as stack yield loss. Either way, stacked die yield must be maximized to maintain or reduce cost. Therefore, all aspects of wafer to wafer stacking will have to be addressed in order to reap full benefits from the 3D stacking process. The other aspects and solutions to maximize yield are addressed according to an embodiment of our invention set forth below.

SUMMARY

According to one embodiment of the present invention, each wafer, in a pair of wafers, is provided with N die, N being a defined value greater than one, and each die having rotational symmetry for ground (GND) and power pads. The input/output {I/O} signal pads to be bonded during wafer stacking are placed in fixed positions around the symmetric boundaries of each die. As part of each embodiment, the wafers chosen to be stacked are first analyzed as a group of wafers to optimize yield upon completion of an M, M being a defined value greater than one, wafer bonded stack. Each successive wafer in the stack is rotated a predetermined amount relative to the wafer that precedes it, in the stack, to maximize the number of good die in alignment. Rectangular die support two rotational positions, whereas square die support four rotational positions. The wafers are then bonded in a stack to achieve optimal yield of the 3D stacked die. Power and ground pads on each die are provided with design symmetry, thereby ensuring that these pads maintain alignment at each rotation. For I/O signal pads, however, a circuit is provided on each die to re route displaced I/O signals after wafer rotation. The I/O signal re-routing allows the wafers to be bonded in an orientation having the highest number of known good die while maintaining signal integrity and die to die performance. A communication channel is provided in each die, and allows communications from one die to the next. Upon completion of the sequential rotations of each wafer in the stack, the re-routed signal pads' locations for the entire die of each wafer is recorded for all of the bonded wafers in a completed stack. In one design of the disclosed embodiment power pads, GND pads, and I/O pads are placed around the periphery of each die. In an alternate design these pads are placed at the center of each die with similar rotational symmetry as the perimeter design. The centralized I/O placement minimizes wiring length and signal skew between the I/O pads and the re-routing circuit.

In another embodiment of the invention, the re-routed positions of the I/O signals can be temporarily or permanently programmed (recorded) on each die and wafer in the stack. The programmed position can be stored on each die in Read Only Memory (ROM), One Time Programmable ROM (OTPROM), Field Programmable Gate Array (FPGA), logic latches, or any other embedded chip design medium. Alternately, the positions of the I/O signals can also be stored in a computer or database and later reloaded to each die in a temporary or permanent programmable medium at completion of the stack during processing, at final part assembly, or in-situ by systems applications.

BRIEF DESCRIPTION OF THE SEVERAL VIEWS OF THE DRAWINGS

FIG. 1 (including FIG. 1A and FIG. 1B) shows the top side and bottom side of a stackable semiconductor die within a wafer that demonstrates pads placed in symmetrical orientation and I/O signal pads placed in a peripheral zone. Geometric shape icons are used to differentiate the pads.

FIG. 3 (including FIG. 3A and FIG. 3B) depicts a cross-section of a die with pictorial representation of two Through-Substrate-Via's (TSV's) demonstrating an aligned configuration where top and bottom wafer pads are connected to the same TSV (FIG. 3A), and a disjoint configuration where top and bottom pads connect to separate circuits in the die (FIG. 3B).

FIG. 5 (including FIG. 5A and FIG. 5B) depicts a physical and logical block diagram representations of disjoint TSV's in a chip stack demonstrating a daisy chained connection from die to die in a 3D stack.

FIG. 11 (including FIG. 11A and FIG. 11B) is a block diagram of complementary instances of the rotational adjustment circuit structure according to an embodiment of the present invention.

DETAILED DESCRIPTION

Figure 1A:
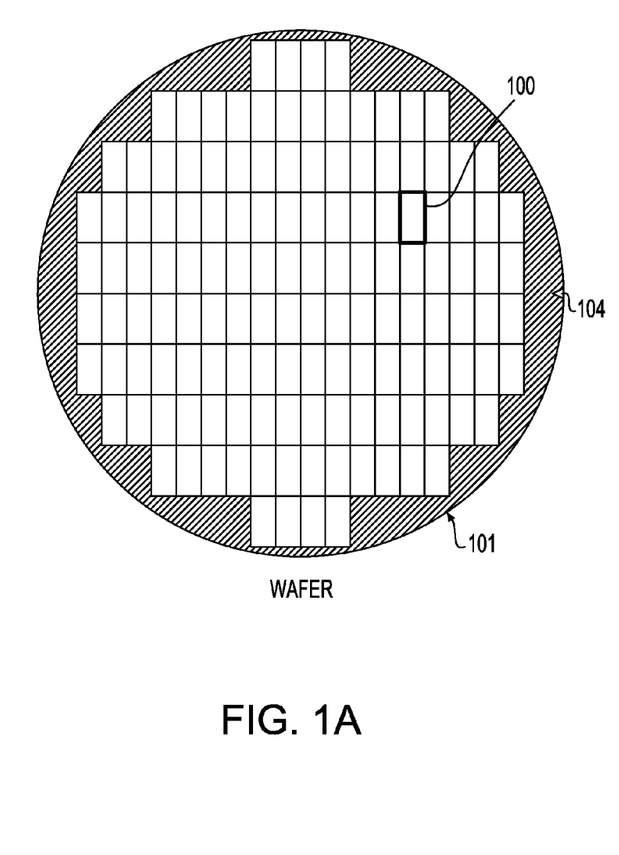
Figure 1B:
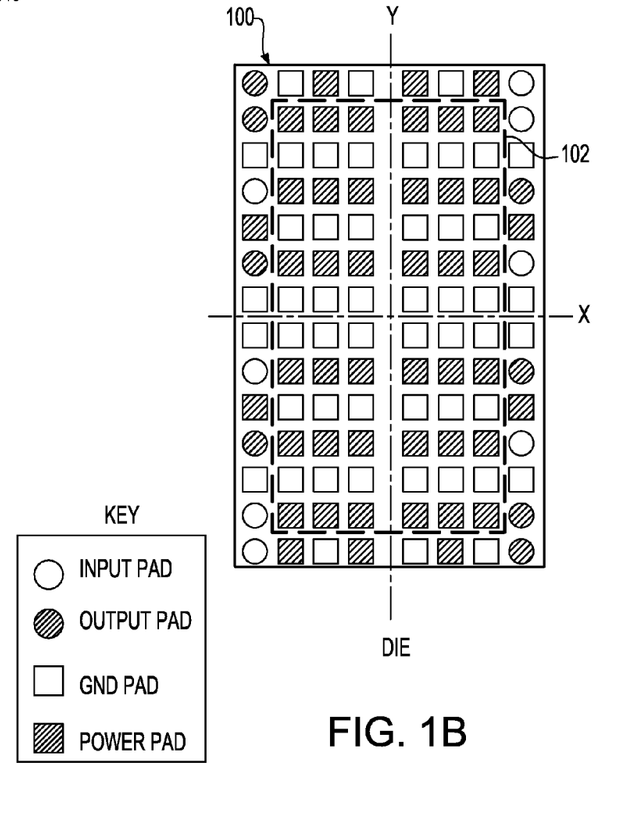

FIG. 1 (including FIG. 1A and FIG. 1B) shows the layout or structure for a semiconductor wafer 101 (FIG. 1A) and an exploded view for one of the die 100 (FIG. 1B) fabricated on the wafer 101. The semiconductor die 100 demonstrates the top or bottom view of the die according to an embodiment of the present invention. As will be discussed in greater detail below, top side pads are connected to bottom side pads with a Through Substrate Via (TSV). A plurality of chips or die (FIG. 1A) are fabricated on the front side of the wafer 101. The notch or mark 104 is provided in the wafer and is used to align one wafer to the next wafer. The wafer 101 is formed from a single semiconductor substrate on which the die is fabricated. The die may take many different shapes, such as rectangular, square, circular, oblong, or any other shapes. The dice on a wafer may be of a single shape or a mix. The dice are placed in symmetrical orientation on the substrate. FIG. 1B shows an exploded view of a die. The connectors or pads on the die are characterized by design symmetry that enables chip to chip connections through a wafer stack. Stated another way, connectors are symmetrically positioned. The connectors are identified by geometric icons as shown in the KEY. In this document, connectors and pads are used interchangeably. With reference to the KEY, the clear circle represents the input signal pads; the hatched circle represents output signal pads, the clear square represents GND (ground) pads, hatched square represents power pads, and so forth.

Still referring to FIG. 1, the symmetry of pads can be demonstrated by partitioning the die into four quadrants by imaginary X-Y (horizontal-vertical) axes and imaginary separator 102 which is depicted by a broken-line rectangle. The imaginary separator 102 partitions the die into a peripheral zone and a central zone. The peripheral zone can be populated by a continuous row or loop of Input/Output (I/O) and power/ground connectors. For example, I/O pads depicted by circular icons provide I/O signals, and square icons provide power/GND connections. This mix of named signals is only explanatory, and should not be construed as a limitation on the embodiment; because it is within the skill of one skilled in the relevant art to provide other mixes without departing from the scope of the disclosure. The non-peripheral or center zone within the broken-line separator 102 can also be populated with pads that are symmetrically placed or positioned. A pad, for example, may be defined as a C4 solder ball connection similar to that used in flip-chip packaging or a metal pad for direct wafer bonding or other schemes. The connections from the die stack to the packaging laminate are not required to follow the rotational symmetry of chip to chip connections, because the die stack can always attach to the package in the same orientation.

Still referring to FIG. 1 (including FIG. 1A and FIG. 1B) each die can be separate entity or device, and can be designed to provide a specific function such as a processor, controller, programmable logic array (PLA) or the like. The wafer 101, including the substrate and dies, may take a different shape or form from that which is shown in the figure. Therefore, the showing in FIG. 1A should be construed as exemplary and not as a limitation on the disclosed embodiment. The wafer 101 can be tested by conventional test routines to identify chips that are good (functional) and those that are bad (non-functional). These test routines are well known in semiconductor technology and will not be discussed further. When another wafer is aligned, stacked, and later physically bonded with wafer 101, the number of maximized functional die in alignment is achieved for each wafer in a completed wafer stack in preparation for dicing and use in down stream assemblies.

Figure 2:
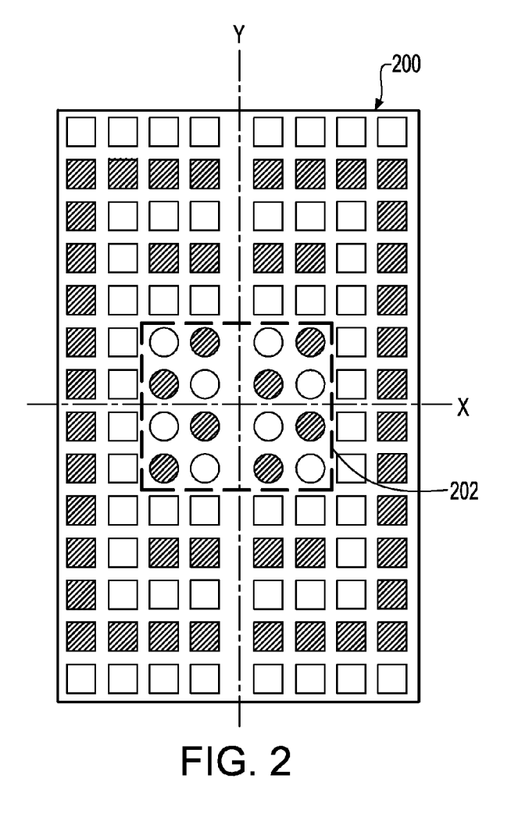
FIG. 2 shows the top or bottom side of a semiconductor die that demonstrates pads placed in a symmetric orientation and I/O signal pads placed in the center (centric configuration) of the die.

FIG. 2 depicts an alternate design that places I/O pads on the top or bottom of a semiconductor die 200. In this embodiment, the broken-line separator 202 partitions the die 200 into a centric section and a non-centric section. The centric section inside of the broken line separator 202 can be populated by I/O signal pads depicted by solid and non-solid circular icons. As illustrated in the KEY, shown in FIG. 1 and previously described, the clear circles represent input signal pads, and the hatched circles represent output signal pads. The non-centric section outside of the broken-line separator 202 is populated with power and GND pads which are depicted, for example, by solid and non-solid rectangular icons. Like FIG. 1, all pads are symmetrically positioned.

With reference to FIG. 1 and FIG. 2, the I/O signal pads in the peripheral zone of FIG. 1 and the I/O signal pads in the center section of FIG. 2 are ultimately connected to circuits on the same chip or die or circuits on another chip or die. Chip and die are used interchangeably herein. However, the transmission path between I/O pads and on-chip circuits in FIG. 2 can be shorter than the transmission path between I/O pads and on-chip circuits in FIG. 1. It should be noted that parasitic capacitance is created when an electrical signal is transmitted over a transmission line. The quantum (amount) of parasitic capacitance is related to the distance over which the signal is transmitted. The longer the distance the greater is the amount of parasitic capacitance generated. In addition, parasitic capacitance has a more adverse effect on relatively high frequency signals than it does on relatively low frequency signals. As a consequence, the centric embodiment of FIG. 2 may be more advantageous for high speed applications; whereas the embodiment of FIG. 1 may be suitable for relatively low speed applications.

Figure 3A:
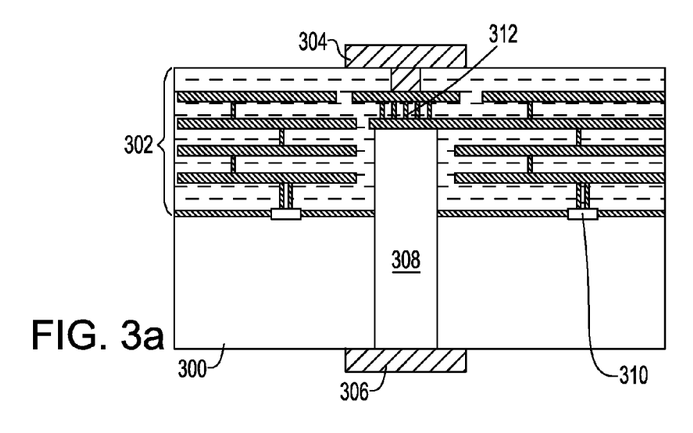
Figure 3B:
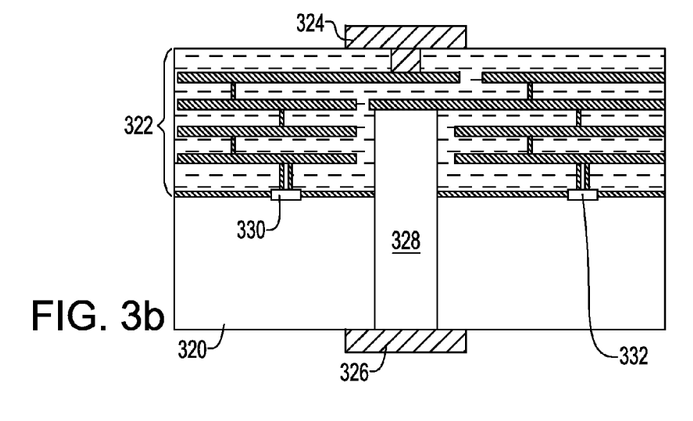

FIG. 3 (including FIG. 3A and FIG. 3B) shows a cross-section view 300 and 320 of a die and a structure that allows information to be communicated from one die to the next die in the stackable wafer. The structure (termed communication channel) in FIG. 3A exemplifies the Aligned Top Pad configuration; wherein TSV 308 connects a bottom pad 306 to a top pad 304 directly above, and in addition to an on chip circuit 310. The structure in FIG. 3B exemplifies the Disjoint Top Pad configuration; wherein the top side pad 324 connects to chip circuit 330 and the bottom side pad 326 connects to a different circuit 332. Die substrates 300 and 320 are similar in both cases, as are semiconductor devices. Except for vias 312 (FIG. 3A), the wiring process levels 302 and 322 are substantially the same.

Figure 4:
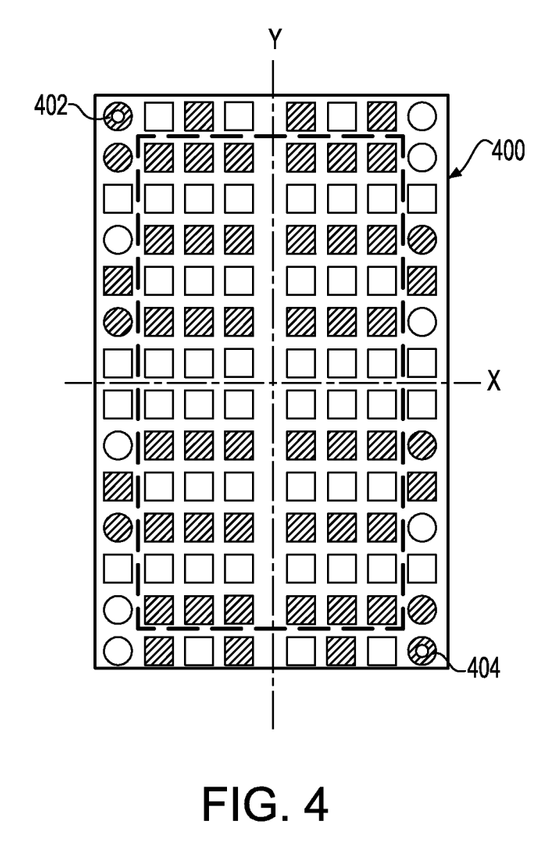
FIG. 4 is a block diagram of the front view of stackable die with disjoint TSV pads added symmetrically at different locations.

FIG. 4 shows a die with symmetrical pad arrangement substantially the same as FIG. 1. In addition, disjoint TSV top input pad 402 and disjoint TSV bottom pad 404 are also shown in exemplary symmetrical position. The top input pad 402 and the bottom output pad 404 are represented by the same icon in the KEY. Stated another way, the new symbol or new icon in the KEY represents either input or output pad. Counting icons in the KEY from bottom to top, the new icon or new symbol is located at the first location. The lay out of pads configuration set forth in FIG. 1 is equally applicable to FIG. 4 and further discussion of FIG. 4 will not be given.

Figure 5A:
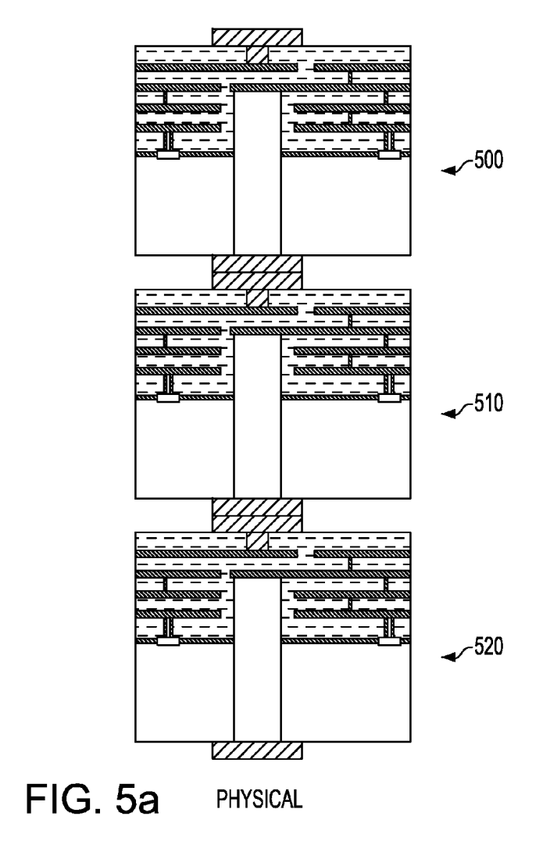
Figure 5B:
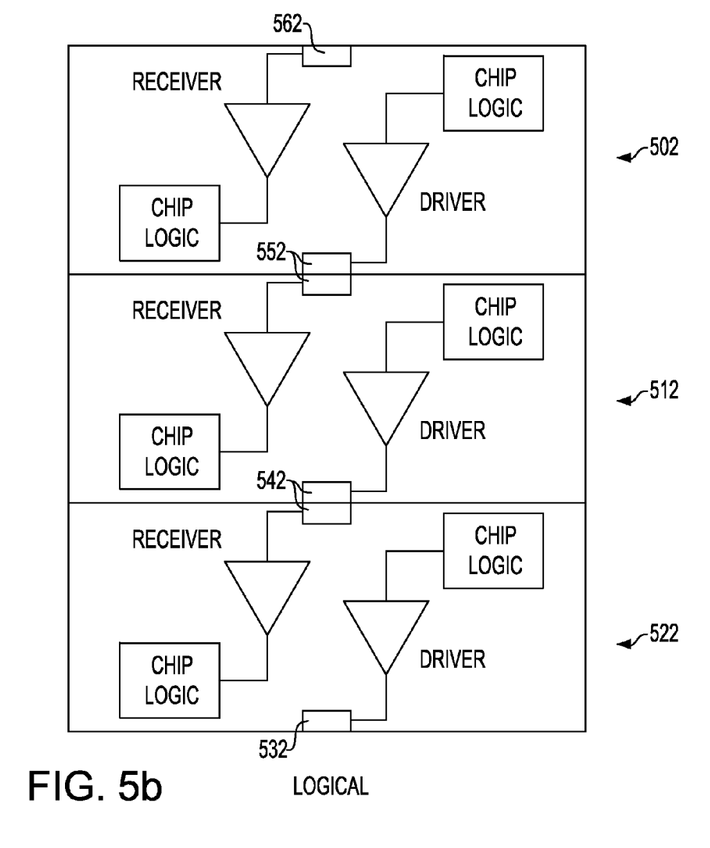

FIG. 5 (including FIG. 5A and FIG. 5B) shows a physical representation (FIG. 5A) and a logical representation (FIG. 5B) of stacked die or wafer. The representation is helpful in understanding how alignment information is passed from one die or wafer to the next. In the figure, the first die or wafer 500 is coupled to the second die or wafer 510 coupled to the third die or wafer 520 forming a daisy chained connection through disjoint TSV's.

Still referring to FIG. 5 (including FIG. 5A and FIG. 5B) the sections of the logical representation of FIG. 5B are also shown in a daisy chained connection through connectors or pads 532 through 562. The logical sections are identical. Therefore, the description of one is applicable to all. Each section includes a receiving branch having a pad or connector, a receiver, and chip logic; all are connected in series. In addition, each section has a driver branch that includes chip logic, driver circuit, and a connector; all are connected in series. Signals into or out of each section are received or transmitted through different pads or connectors.

Figure 6:
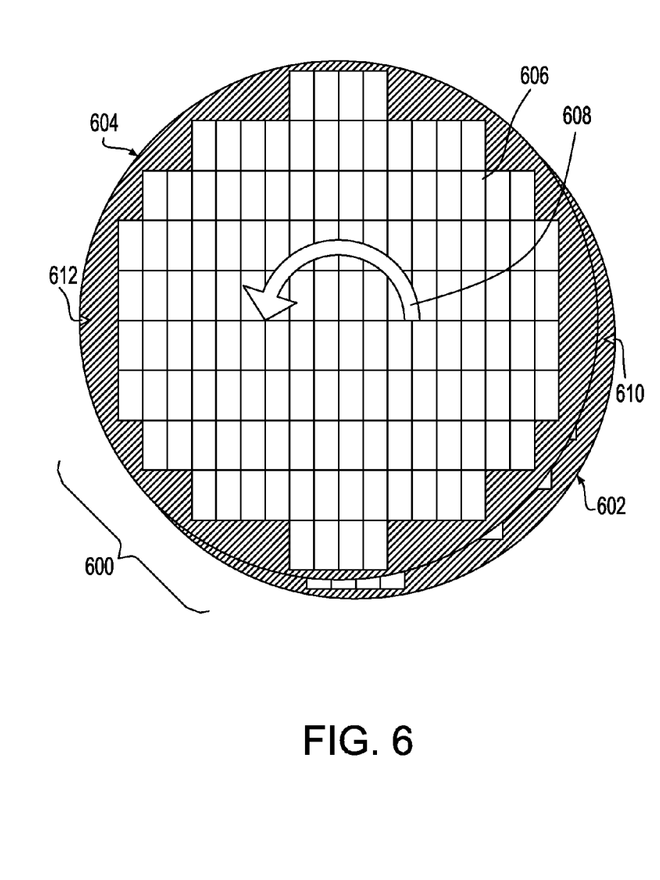
FIG. 6 is a pictorial representation of two wafers in alignment with one wafer rotated with respect to the other wafer.

FIG. 6 shows a wafer to wafer stack 600 that can be comprised of wafer 602 and wafer 604. The wafers are shown stacked in a front to back configuration. Each of the wafers can be populated on the front side with a plurality of die or chips 606. The chips on each wafer may have identical structure and provide identical functions or may have different structures and provide different functions. In addition, the chips are enabled for 3D stacking, wherein a stack is formed by a plurality of chips including electrical and physical connections between chips in said stack. Finally, each of the chips may function independently or in conjunction with other chips. TSVs (not shown) are provided in each chip to connect top pads with bottom pads (as shown in FIG. 3). Conductors deposited in the TSV allow inter-chip communication. Intra-chip communication can be provided by conventional means.

Still referring to FIG. 6, the backside of each wafer has a population of pads like the lay-out of pads described in FIG. 4. An alternate design of pads would be the one described in FIG. 2 above. Additional wafers may be added to be in alignment with wafer 602 or 604 to create a stack of a desired depth. The relation between any pair of wafers, such as wafer 602 and 604, can be such that one can rotate a full 360 degrees, beginning at 0 degrees. Alternately, the rotatable wafer may traverse only a part of the 360 degrees. In an embodiment of the present invention (FIG. 6), the number of rotation angles are two (0 degrees and 180 degrees), though other embodiments may include 90 degrees, 270 decrees, or other degrees of rotations from 0 degrees. In FIG. 6, wafer 604, including attached or enclosed die, is rotated 180 degrees, counter clockwise, from its initial orientation of 0 degrees. The direction of rotation is shown by arrow 608. The lower wafer 602 is in a fixed (non-rotated) 0 degree orientation as indicated by the wafer notch position 610. In addition to the 180 degree orientation, the upper wafer 604 with wafer notch position 612 is slightly offset to display the lower wafer 602. When bonded, wafer 604 is directly above wafer 602. When wafer 604 is in a 0 degree orientation (i.e. prior to rotation) the notches on both wafers are aligned.

Figure 7:
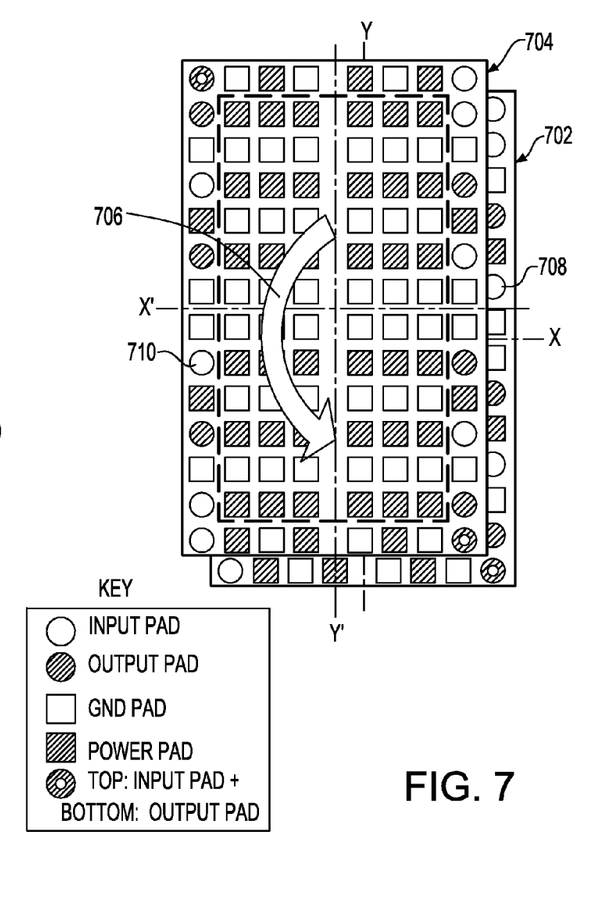
FIG. 7 is a pictorial representation of two die in alignment with one die rotated with respect to the other die.

FIG. 7 shows the die level view of wafer rotation described above in FIG. 6. Top die 704 is shown offset from bottom die 702, but in the bonded stack, the top die 704 is directly above the bottom die 702. In addition, periphery pads in the exposed row on wafer 702 align with pads in the die 704 periphery row, external to the broken separator line, on die 704. The pads align for 0 degree orientation (not shown) and 180 degree orientation shown by arrow 706. Prior to rotation, the I/O signal pad 710 would be aligned with I/O signal pad 708 on die 702 that is stationary. However, after 180 degree rotation, I/O signal pad 710 is at a different location relative to I/O signal pad 708 on die 702. This difference can be compensated for by the rotation adjustment circuit which can be fabricated on each die and is described in detail below.

Figure 8:
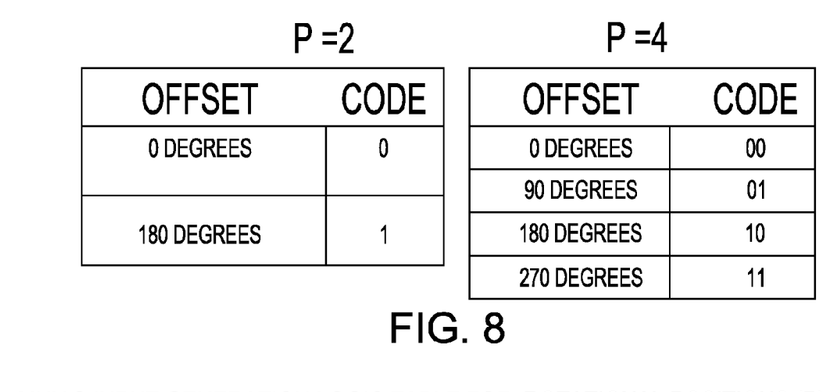
FIG. 8 depicts tables defining codes for different numbers of rotational offsets (P).

FIG. 8 shows two tables; each table represents codes assigned for the number of rotational offset positions (P) of a wafer with respect to the previous wafer in the stack. Each table has two columns, labeled Offset and Code. The Offset column contains the number of degrees that one wafer is offset relative to a previous wafer in the stack. The Code column contains the code that can be assigned for a particular rotational offset. The table on the left represents information for P=2, with a code of 0 for 0 degree offset and a code of 1 for a rotation of 180 degrees. Likewise, the table on the right represents degrees and code for the rotational positions P=4, with a code of 00 for 0 degrees, a code of 01 for 90 degrees, and so forth. The number of rotational offsets P supported in die and wafer design symmetry determine the number of different code values required. The codes from the tables are used by the rotational adjustment circuit described below.

Figure 9:
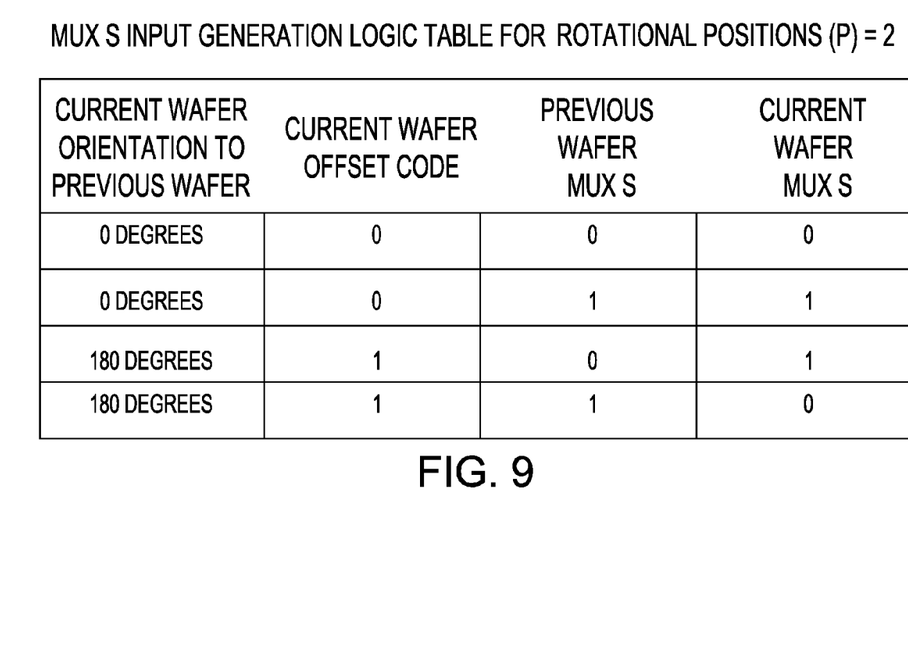
FIG. 9 depicts a table defining the logic required in case of P=2 rotational offsets.

FIG. 9 shows a table defining values used to drive the rotational offset adjust circuit MUX select input S (FIG. 11) for the case of P=2 rotational positions supported in die and wafer design symmetry. As shown in this example, the rotational offset adjustment circuit MUX select input S on the current wafer or die is a function of the value of MUX select input S on the previous wafer exclusive ORed with the current wafer's offset code when P=2. Other designs and similar tables for other values of P may be defined by someone skilled in the art.

Referring again to FIG. 5 and FIG. 9, the previous wafer MUX select value S has to be forwarded to the next wafer in the stack. To do so, the previous MUX select value S can be connected from one wafer to the next wafer using a unique set of disjoint TSVs and pads (FIGS. 3 and 5) that allow top side input signal pads to be positioned above bottom side output pads. This unique set of pads can be replicated P times to allow the pads to be in the same relative position on the die or wafer regardless of the die offset rotation relative to the previous die or wafer. These pads communicate the rotational offset circuit MUX select value S of the previously stacked wafer to the next wafer in the stack for use by rotational offset adjustment logic in the subsequently stacked wafer.

Figure 10:
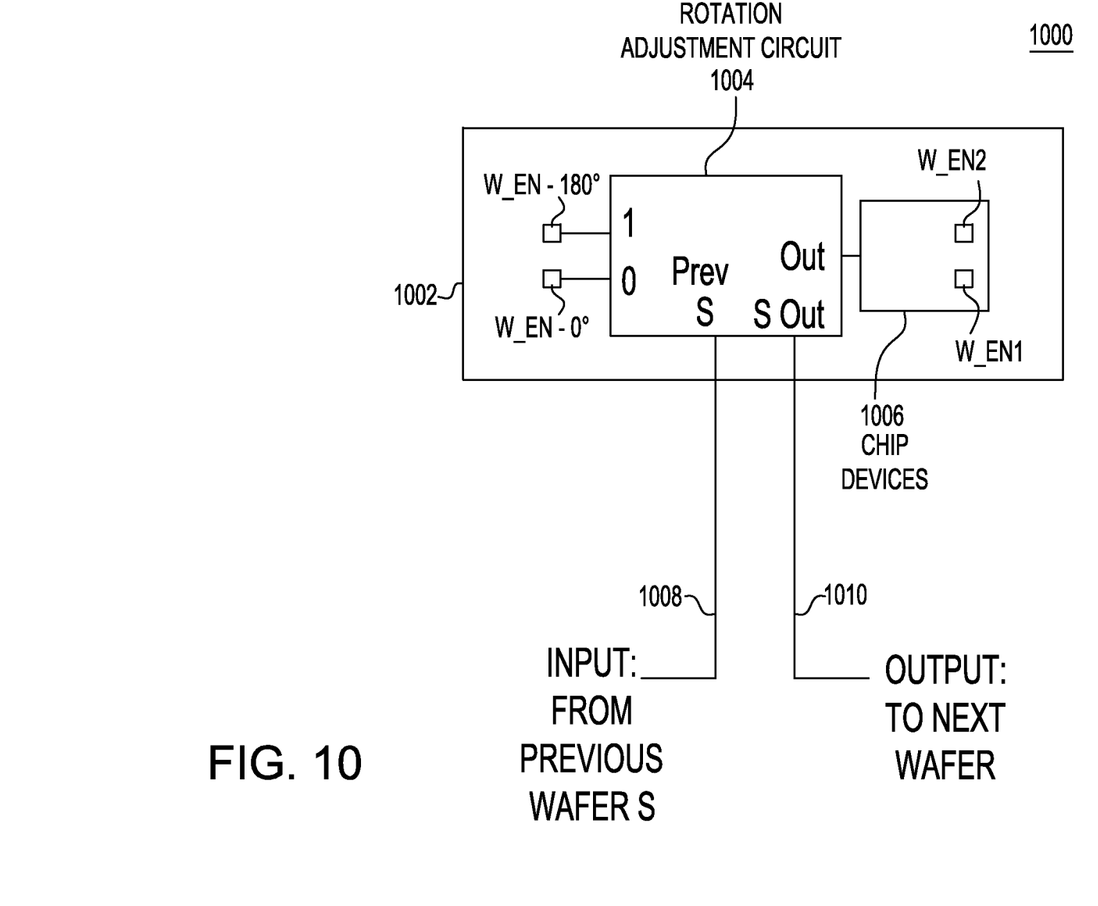
FIG. 10 depicts a block diagram of a chip stacked in a 3D configuration and a rotation adjustment circuit coupling an I/O pad, in a rotated and non-rotated state, to circuits on the chip.

FIG. 10 shows a portion of a single chip design 1000, contained in one level of 3D chip stack, fabricated according to teachings of an embodiment of the present invention. Chip design 1000 constructed on substrate 1002 includes rotation adjustment circuit 1004 and chip circuit device 1006 including receiving/driving buffers distributing the received signal to the rest of the die design such as W_EN1 and W_EN2. The chip device 1006 may implement a microprocessor, PLA, controller, or the like. An I/O signal pad, such as I/O signal pad 710 (FIG. 7), is depicted in two orientations: namely 0 degrees and 180 degrees. For the purpose of explanation, the I/O pad in the 180 degrees orientation can be labeled W_EN_180°, and when in the 0 degree orientation it can be labeled W_EN_0°. Both pads are coupled to rotation adjustment circuit 1004. A control signal on conductor 1008 is delivered to rotation adjustment circuit 1004. The signal from W_EN_180° or W_EN_0°, depending on the rotation of the die, can be delivered from rotational adjustment circuit 1004 Output port to chip circuit devices 1006 connected by on-chip distribution signals W_EN1, W_EN2 or both. Rotation adjustment circuit 1004 has two input terminals or ports labeled 1 and 0. Port 0 can be connected to W_EN_0°, and pad W_EN_180° can be connected to Port 1. A control or select port labeled Pre S can be set to 0 or 1, as received on conductor 1008 as input from the previous rotational adjustment circuit on previous wafers. The rotational adjustment circuit 1004 MUX S output for substrate 1002 is driven from the S Out port on conductor 1010 to the next wafer in the stack.

Figure 11A:
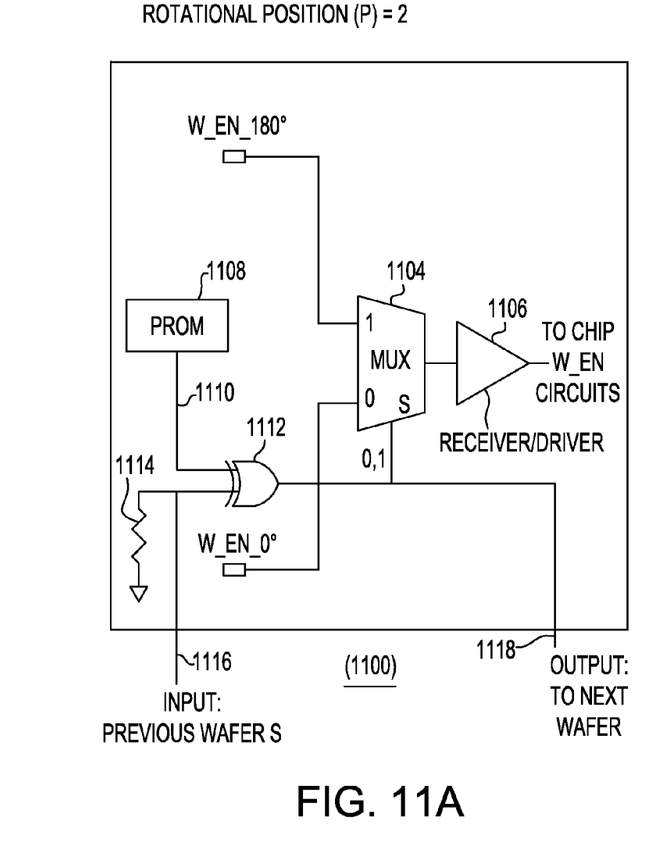

FIG. 11A shows a circuit schematic 1100 for the Rotation Adjustment Circuit 1004 (FIG. 10). The circuit schematic includes multiplexer (MUX) circuit 1104, Receiver/Driver circuit 1106, and exclusive OR gate (XOR) 1112. The named components or circuits are operatively coupled as shown in the figure. PROM 1108 for storing a positional offset code can be connected to one terminal of XOR circuit 1112. A pull down resistor 1114 on the previous wafer's MUX select S input 1116 can be connected to the other terminal of the exclusive OR circuit 1112. MUX 1004 has two input terminals or ports labeled 1 and 0. Port 0 can be connected to pad W_EN_0°, and pad W_EN_180° can be connected to Port 1. A control or select port labeled S can be set to 0 or 1, depending on the orientation of the die or chip. In the disclosed embodiment the MUX select signal S can be generated by the exclusive OR gate 1112; but other types of S generation logic can be provided by one skilled in the art with out deviating from teachings of the present disclosure. The output from the Receiver/Driver circuit 1106 can be delivered to designated circuits on the chip on which the rotation adjustment circuit can be located.

Figure 11B:
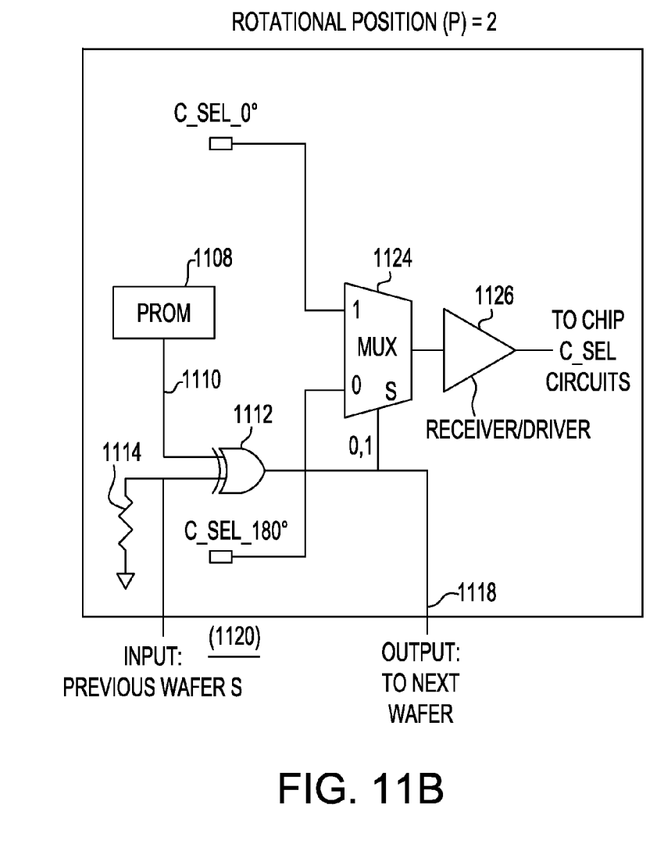

FIG. 11B shows an optional complementary circuit schematic 1120, for improve efficiency of signal pad utilization. The input of MUX 1124 that is labeled 1 can be connected to pad C-SEL-0 degrees (the same physical die pad labeled W_EN_180 degrees in FIG. 11A) and the input of MUX 1124 that is labeled 0 can be connected to pad C-SEL-180 degrees (the same physical die pad labeled W_EN_0 degrees in FIG. 11A) The complimentary circuit 1120 allows both pads 708 and 710 in FIG. 7 to be utilized, one for chip signal W_EN and the other for chip signal C_SEL in a swappable arrangement for both positional offset values when P=2. Except for this switch in pad connections, components and operation of rotational adjustment circuit 1120 are substantially the same as components and operation of rotation adjustment circuit 1100 which have already been described. Therefore, further discussion of the rotation adjustment circuit in FIG. 11B is not warranted. The switch in pad connections shown in FIG. 11B may be required for connection pad efficiency. For example, two different signals may occupy the swappable positions 708 and 710 in FIG. 7. If this were to occur, the configuration of FIG. 11B would be appropriate. Other configurations are possible without deviating from the teachings of the embodiment.

Referring to FIG. 11A and FIG. 11B, for the disclosed exemplary embodiments, the rotating die or wafer can be placed in two orientations relative to the previously stacked die or wafer: namely 0 degrees and 180 degrees. Therefore, as shown in FIG. 8 for P=2 a single bit with two unique states 0 and 1 is sufficient. From FIG. 9 when the previous die in the stack has rotational offset adjust MUX select S=0, and when the subsequent die or wafer is at the 0 degree orientation relative to the previously stacked die or wafer, 0 can be applied to current MUX select S, and pad W_EN_0 which can be connected to port 0 can be selected. Likewise, when the subsequent die or wafer is in the 180 degree orientation, 1 can be applied to S, and pad W_EN_180, which can be connected to port 1, can be selected. The value applied to rotational offset adjust MUX 1104 select S when the previously stacked die or wafer has rotation offset adjust MUX select S=1 can be shown in FIG. 9. The output port from rotation adjustment MUX 1104 can be coupled to Receiver/Driver 1106. It should be noted that the orientation selection is one of design choice and others can be selected without departing from the teachings of the disclosed embodiment. For example, if the rotating die has four orientations (P=4), such as 0, 90, 180, and 270; then a two bit code would suffice (FIG. 8); and Port S, of the Rotation Adjustment Circuit 1104, could be set to one of 00, 01, 10, or 11 to select one of the four inputs.

Figure 12:
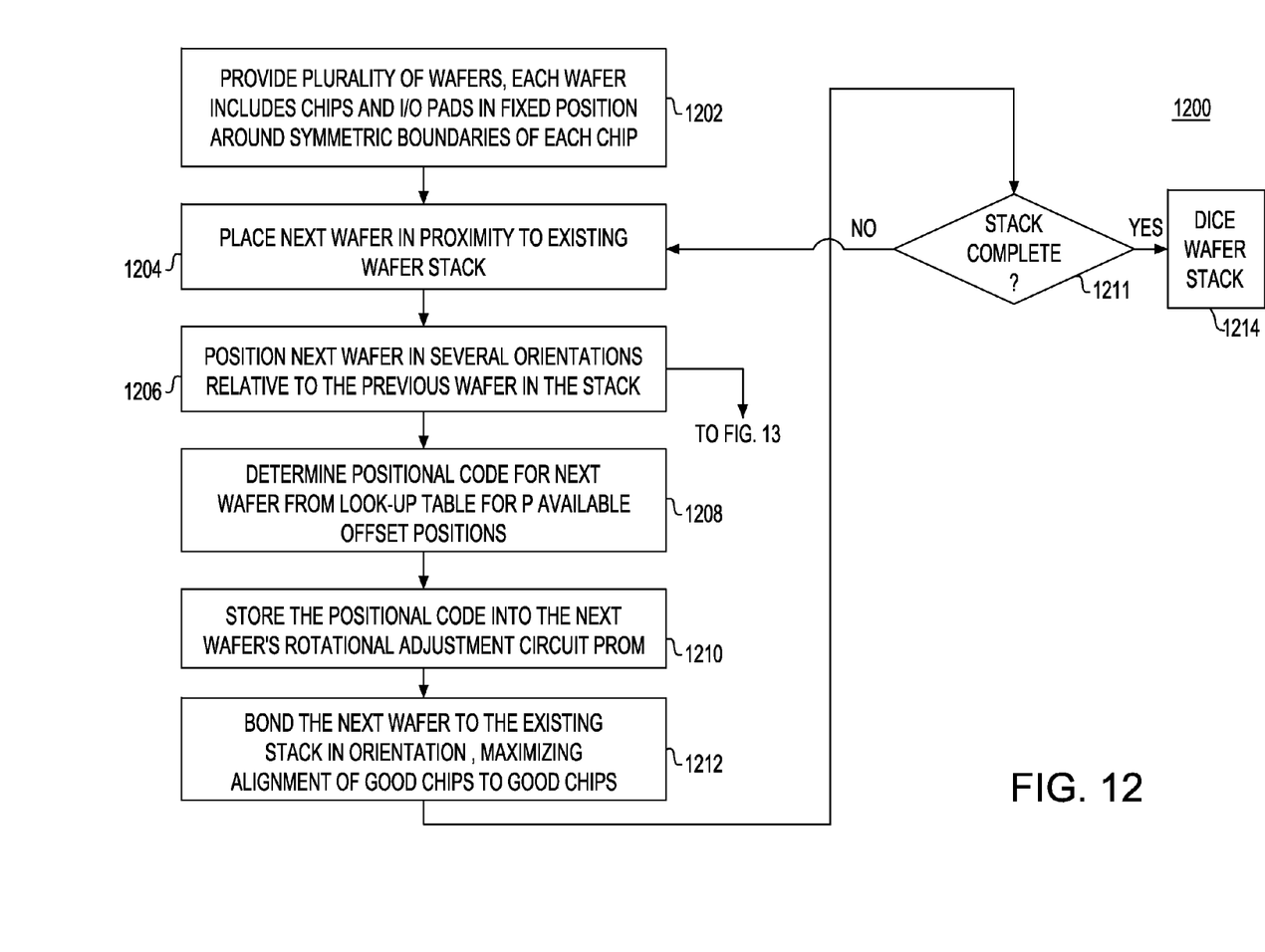
FIG. 12 is a flow chart of a method according to an embodiment of the present invention.
Figure 13:
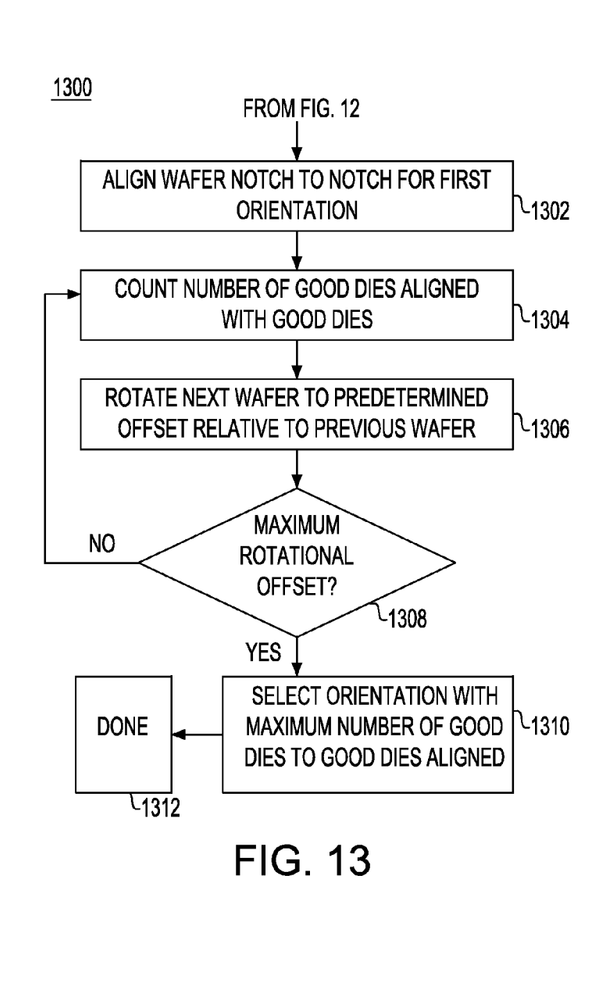
FIG. 13 is a flow chart that gives more details for one of the acts or steps in the method or process of FIG. 12.

FIG. 12 is a flow chart 1200 of the method or process according to the disclosed embodiment. The method includes steps or acts 1202 through 1214, with further details of act 1206 shown in flow chart 1300 (FIG. 13). The process begins in step 1202; wherein a plurality of wafers can be provided. Each wafer has N chips, N is a defined value of the designer's choice; and I/O pads are placed symmetrically in the periphery or center of the die. In addition, power and GND pads are designed with rotational symmetry so that when one of these specially designed wafers is stacked with another wafer the chip power and ground pads are always in alignment for any rotational position for one of the stacked wafers. Also, signal I/O pads are placed in fixed position, but change location due to rotation.

In step 1204, a pair of wafers can be placed in proximity. This step can be performed by a computer controlled wafer stacking apparatus that can be programmed to place the wafers in stacked arrangements, rotate the wafers, and performed other functions needed to form a wafer stack.

In step 1206, one wafer can be held stationary and the other wafer can be placed in a predetermined number of orientations relative to the fixed wafer. Further details of this step are set forth below.

In step 1208, the rotational offset determined in step 1206 can be coded into one of P codes depending on the number of positional offsets P supported in die and wafer design symmetry.

In step 1210, an adjustment circuit PROM, provided on each chip, can be programmed with the positional offset code of step 1208 enabling signals received from the I/O signal pad to be re-routed and delivered according to the Rotational Adjustment Circuit described above.

In step 1212, the next wafer can be bonded with the previous wafer in the stack in the orientation that maximizes the alignment of good chips on the next wafer with good chips on the previous wafer in the stack. The bonding can be done at any facility supporting full wafer bonding within the semiconductor fabrication facility.

In step 1211, it can be determined if the stack is complete (that is, no more wafers are in the stack to be processed). If it is not complete, the process loops and performs steps 1204 through 1211, which have already been described. If the stack is complete (that is, no more wafer in the stack to be processed), the process performs step 1212 as described below.

The step 1212 may be optional; if practiced, the bonded wafers are then diced (step 1214) into 3D chips at a conventional dicing station.

Referring to FIG. 13, the flow chart shows additional steps to perform positional step 1206 (FIG. 12). The process begins in step 1302, whereat the first (0 degree) orientation occurs by aligning the notch that is provided on each of the wafers. The process then performs step 1304 by counting the number of good die aligned with good die. The process then performs step 1306 by rotating one of the wafers a predetermined offset. In the disclosed embodiment the offset can be 180 degrees (step 1308). The process then loops back to step 1304, if the maximum rotational offset (180 degree for P=2) was not reached in the current pass. If the maximum rotational offset was reached, the process enters step 1310, and counts the number of good die aligned to good die. The process then enters step 1312, and selects the orientation with maximum number of good die to good die aligned. The process can be terminated in step 1314.

Figure 14:
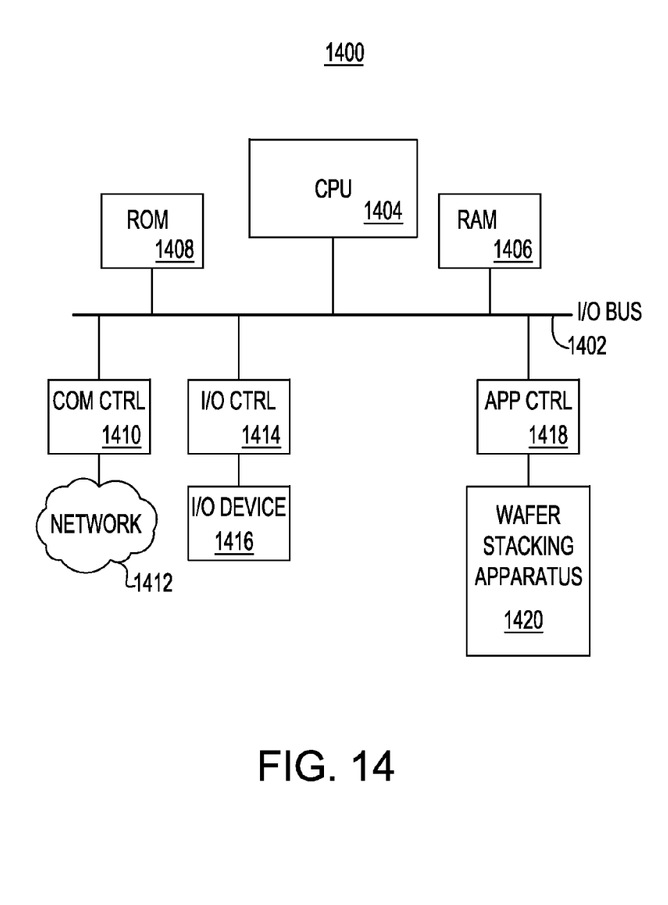
FIG. 14 is a block diagram illustrating an exemplary hardware environment associated with the disclosed embodiment.

FIG. 14 is a block diagram that illustrates an exemplary hardware environment for the computerized wafer stacking apparatus associated with the disclosed embodiment. Other type of systems suitable to perform functions of the disclosed embodiment can be designed by a skilled artisan. Therefore, the exemplary hardware should not be construed as a limitation on the scope of the disclosed embodiment. The exemplary hardware 1400 includes Input/Output (I/O) Bus 1402. CPU 1404, ROM 1408, and RAM 1406 are connected to the I/O Bus. Communication (COM) Controller (Ctrl) 1410, I/O Ctrl 1414, and Apparatus (APP) Ctrl 1418 are also connected to the I/O Bus. The respective controllers provide a pathway so that external sources, such as servers or the like on network 1412, I/O devices 1416, and wafer stacking apparatus 1420, can communicate with the CPU and associated ROM and RAM. The CPU may take the form of one or more die with structure as described above. Likewise, controllers for the CPU or otherwise may be implemented as one or more die.

Still referring to FIG. 14, the wafer stacking apparatus 1420 under control of the CPU positions, rotates etc. wafers as describe above. The program necessary to perform the functions can be entered by an operator through I/O devices 1416, which may include keyboard, scanners, computer readable medium or the like. The programs can be stored in ROM 1408 and can be retrieved when needed by the CPU. Tables such as those described above can be stored in RAM 1406. The network 1412 may include local area network (LAN), internet or similar network. Devices, such as servers or the like, connected to the network can download information to control the wafer stacking apparatus. It is within the skill of one skilled in the art to provide other means to control the wafer stacking apparatus without deviating from the teachings of the disclosed embodiment.

The embodiments of the invention as detailed herein may be realized in whole or in part. A chip including an embodiment of our invention may include only centrally located signal pads, or only a rotation adjustment circuit, or a combination thereof for portions or the entirety of a chip. A 3D stack may include portions of this embodiment of the invention on one or a plurality of chips in said stack, which may be a homogeneous stack with a plurality of similar chips, or a heterogeneous stack with a plurality of different types of chips.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a three-dimensional (3D) wafer to wafer stack implemented on a computer controlled wafer stacking apparatus, said method comprising:
   providing, in said computer controlled wafer stacking apparatus, a plurality of wafers in a stack, each wafer having N chips, N is a defined value greater than 1, and I/O pads having fixed position around the symmetric boundaries of each chip;
   placing a next wafer in proximity to a previous wafer in the stack;
   positioning the next wafer in a defined number of orientations relative to the previous wafer in the stack;
   providing orientation code for each of the defined number of orientation for said next wafer;
   selecting an orientation code for the next wafer;
   storing the orientation code, so selected, for said next wafer; and
   bonding the next wafer to the existing stack in an orientation maximizing alignment of good chips on said next wafer to good chips on the previous wafer in the stack; wherein the code is used to reroute signals from a pad on the next wafer that has been located due to rotation of said next wafer.

2. The method of claim 1 wherein each of the wafers includes a notch for aligning to another wafer, and the act of positioning further comprises aligning the next wafer and the previous wafer in the stack so that the notches are aligned to indicate a first one of the defined number of orientations; counting, by a processor device, the number of good die of the next wafer aligned with good die of the previous wafer in the stack; rotating, by the processor controlled wafer stacking apparatus, the next wafer a defined offset to indicate a second one of the defined number of orientations; counting, by the processor, the number of good die of the next wafer aligned with good die of the previous wafer in the stack; repeating the counting and rotating acts until the rotated wafer has an offset of approximately 360 degrees minus the amount of the original rotation after the notches were aligned; and selecting, by the processor, the orientation of the wafer with maximum number of good die aligned.

3. The method of claim 2 wherein the first one of the defined number of orientations is approximately 0 degrees and the second one of the defined number of orientations is approximately 180 degrees.

4. The method of claim 1 wherein the act of selecting further includes defining a number of positions (P) that the next wafer can be rotated relative to the previous wafer in the stack; determining, for said next wafer, an offset orientation state for each of the defined number of positions (P); assigning a code for each of the offset orientation states; and recording in a memory the number of positions (P) for the next wafer, the offset orientation states for the number of positions (P), and corresponding assigned code for each orientation state.

5. The method of claim 4 wherein the memory is in a computer.

6. The method of claim 4 wherein the memory is on at least one of the chips.

7. The method of claim 4 wherein the offset orientation states for said next wafer include 0 degrees and 180 degrees.

8. The method of claim 1 wherein each wafer includes symmetric power and ground (GND) pads and when the act of positioning the next wafer in a defined number of orientations, relative to the previous wafer in the stack, occurs when the ground and power pads on the next wafer and the ground and power pads on the previous wafer in the stack are in alignment for each of the defined number of orientations.

9. The method of claim 1 further including determining the status of the stack; and if the next wafer is the last wafer in the stack, dicing the bonded wafers into three dimensional chips.

10. The method of claim 9 wherein if the next wafer is not the last wafer in the stack repeating acts (1204) through (1211) (FIG. 12) until the next wafer is the last wafer in the stack.

11. The method of claim 1 further including re-routing signals, with a rotation adjustment circuit, received from one of the I/O pads whose position changes as a result of a rotation of said next wafer.

12. The method of claim 1 wherein the orientation code include 0 for an orientation of 0 degrees and 1 for an orientation of 180 degrees.

13. A 3D system comprising:
at least two die;
a first device fabricated on one of said at least two die;
at least one input/output (I/O) connector fabricated on said one of said at least two die, wherein said at least one connector is placed in a fixed position around symmetrical boundaries of said one of said two die, and said at least one I/O connector can be located in one of P positions, P being a defined value greater than 1, due to a rotation of said one of said at least two die; and
a rotation adjustment circuit operable to receive signals representative of rotational location from the at least one I/O connector at each of the P positions, receive signals representative of the rotational orientation of another one of the at least two die, using the signals from the another one of the at least two die to select signals provided from one of the P positions, forwarding selected signals to other circuits on the die and forwarding to other die the signals from the another one of the at least two die; wherein said signals include coded bits representing rotational positions.

14. The 3D system of claim 13 further including a power connector and a ground (GND) connector that are placed in rotational symmetry around the symmetrical boundaries of said one of said at least two die.

15. The 3D system of claim 14 wherein the at least one input/output connector, the power connector, and GND connector are placed in a center location of said one of said at least two die.

16. The 3D system of claim 13 further including a second device fabricated on another of said at least two die and stacked relative to the first device.

17. The 3D system of claim 13 wherein the rotation adjustment circuit includes a multiplexer having M inputs, M being a defined value greater than 1, wherein each of the M inputs is connected to a pad representing a degree of rotation, a select input operable to select one of the M inputs, an Exclusive OR gate with an output connected to the select input and a first input for receiving a signal from a previous wafer, a PROM having an output connected to another input of the Exclusive OR gate and a receiver/driver circuit connected to an output port of said multiplexer.

18. The 3D system of claim 16 wherein the first device and second device are homogenous, including processors.

19. The 3D system of claim 16 wherein the first device and the second device are non-homogenous, including a processor and a controller.

20. A circuit arrangement for re-routing signals in a 3D semiconductor structure, said circuit arrangement comprising:
a multiplexer having P input ports, wherein P is a defined value greater than 1, a select port S, and an output port;
P input pads connected to the multiplexer, with each of the P input pads representing a degree of rotation available to one of a die and wafer within the 3D semiconductor structure;
a receiver/transmitter circuit operatively coupled to the output port, wherein said select port S is operable to receive a control signal that selects one of the P input ports based on the relation between said one of the P input ports and the rotational state of a die in said 3D semiconductor structure.

21. The circuit arrangement for re-routing signals of claim 20 further including a logic circuit for generating the control signal operatively coupled to the select port S.

22. The circuit arrangement for re-routing signals of claim 21 wherein the logic circuit includes an exclusive OR gate, a first code representing an orientation of a die within said 3D semiconductor structure operatively coupled to an input port of said exclusive OR gate, and a second code representing a value for an input port S from another die preceding said die operatively coupled to another input port of said exclusive OR gate.

23. The 3D system of claim 13 further including a communication channel fabricated in each of said at least two die, said communication channel operable to transmit control information from one die to the next.

24. The 3D system of claim 23 wherein the communication channel includes a pair of pads, wherein each pad is symmetrically located on opposite sides of each die and a Through Substrate Via (TSV) inter-connecting the oppositely placed pads in each die.

25. The method of claim 1 wherein each of said wafers further includes a substrate on which the chips, including homogeneous and non-homogeneous, are symmetrically placed and pads are also symmetrically placed and wherein the symmetrically placed pads on the substrate of a wafer in the stack are always in alignment with symmetrically placed pads on the next wafer for any orientation of said next wafer relative to the wafer in the stack.

26. A semiconductor system comprising:
a substrate;
a device to generate specific functions operatively fabricated on said substrate;
a plurality of input/output (I/O) pads provided with rotational symmetry operatively fabricated on said substrate; and
a rotation adjustment circuit operatively fabricated on said substrate, said rotation adjustment circuit operable to receive signals from a plurality of rotational positions (P) assigned to one of the plurality of input/output pads, receive signals representative of rotational position associated with a first die not on the substrate, selecting signals provided by one of the plurality of rotational positions based on the state of the signals receive from the first die and re-route selected signals to the device and re-route signals from the first die to a second die; wherein said signals include coded bits representing rotational positions.

* * * * *